United States Patent
Burrows et al.

(10) Patent No.: US 8,955,217 B2
(45) Date of Patent: Feb. 17, 2015

(54) METHOD FOR EDGE SEALING BARRIER FILMS

(75) Inventors: Paul Burrows, Kennewick, WA (US); J. Chris Pagano, Santa Clara, CA (US); Eric S. Mast, Richland, WA (US); Peter M. Martin, Kennewick, WA (US); Gordon L. Graff, West Richland, WA (US); Mark E. Gross, Pasco, WA (US); Charles C. Bonham, Richland, WA (US); Wendy D. Bennett, Kennewick, WA (US); Michael G. Hall, West Richland, WA (US)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/353,635

(22) Filed: Jan. 19, 2012

(65) Prior Publication Data

US 2012/0118855 A1    May 17, 2012

Related U.S. Application Data

(60) Division of application No. 11/068,356, filed on Feb. 28, 2005, now abandoned, which is a division of application No. 09/966,163, filed on Sep. 28, 2001, now Pat. No. 6,866,901, which is a continuation-in-part of application No. 09/427,138, filed on Oct. 25, 1999, now Pat. No. 6,522,067.

(51) Int. Cl.
*H01L 23/10* (2006.01)
*H01L 23/00* (2006.01)
(Continued)

(52) U.S. Cl.
CPC ............ *H01L 23/562* (2013.01); *H01L 23/564* (2013.01); *H01L 51/5237* (2013.01);
(Continued)

(58) Field of Classification Search
CPC . H01L 23/562; H01L 23/564; H01L 51/5237; H01M 2/08
See application file for complete search history.

(56) References Cited

U.S. PATENT DOCUMENTS

| 2,382,432 A | 8/1945 | McManus et al. |
| 2,384,500 A | 9/1945 | Stoll |

(Continued)

FOREIGN PATENT DOCUMENTS

| BE | 704297 | 2/1968 |
| CA | 2 353 506 | 5/2000 |

(Continued)

OTHER PUBLICATIONS

De Gryse, R., et al., Sputtered Transparent Barrier Layers, 10th International Conference on Vacuum Web Coating (Edited by R. Bakish) aka the 10th Bakish Conference; 1996, pp. 190-198.

(Continued)

*Primary Examiner* — Livius R Cazan
(74) *Attorney, Agent, or Firm* — Dinsmore & Shohl LLP

(57) ABSTRACT

An edge-sealed barrier film composite. The composite includes a substrate and at least one initial barrier stack adjacent to the substrate. The at least one initial barrier stack includes at least one decoupling layer and at least one barrier layer. One of the barrier layers has an area greater than the area of one of the decoupling layers. The decoupling layer is sealed by the first barrier layer within the area of barrier material. An edge-sealed, encapsulated environmentally sensitive device is provided. A method of making the edge-sealed barrier film composite is also provided.

12 Claims, 3 Drawing Sheets

(51) Int. Cl.
   *H01L 51/52*   (2006.01)
   *H01M 2/08*   (2006.01)
   *G02F 1/1333*   (2006.01)
   *H01L 51/00*   (2006.01)

(52) U.S. Cl.
   CPC .... *H01M 2/08* (2013.01); *G02F 2001/133337* (2013.01); *H01L 51/003* (2013.01); *H01L 2924/12044* (2013.01); *H01L 2924/0002* (2013.01)
   USPC ............................................ 29/841; 438/127

(56) References Cited

U.S. PATENT DOCUMENTS

| | | |
|---|---|---|
| 3,475,307 A | 10/1969 | Knox et al. |
| 3,496,427 A | 2/1970 | Lee |
| 3,607,365 A | 9/1971 | Lindlof |
| 3,661,117 A | 5/1972 | Cornelius et al. |
| 4,061,835 A | 12/1977 | Poppe et al. |
| 4,098,965 A | 7/1978 | Kinsman |
| 4,266,223 A | 5/1981 | Frame |
| 4,283,482 A | 8/1981 | Hattori et al. |
| 4,313,254 A | 2/1982 | Feldman et al. |
| 4,426,275 A | 1/1984 | Meckel et al. |
| 4,521,458 A | 6/1985 | Nelson |
| 4,537,814 A | 8/1985 | Itoh et al. |
| 4,555,274 A | 11/1985 | Kitajima et al. |
| 4,557,978 A | 12/1985 | Mason |
| 4,572,845 A | 2/1986 | Christen |
| 4,581,337 A | 4/1986 | Frey et al. |
| 4,624,867 A | 11/1986 | Iijima et al. |
| 4,695,618 A | 9/1987 | Mowrer |
| 4,710,426 A | 12/1987 | Stephens |
| 4,722,515 A | 2/1988 | Ham |
| 4,768,666 A | 9/1988 | Kessler |
| 4,842,893 A | 6/1989 | Yializis et al. |
| 4,843,036 A | 6/1989 | Schmidt et al. |
| 4,855,186 A | 8/1989 | Grolig et al. |
| 4,889,609 A | 12/1989 | Cannella |
| 4,913,090 A | 4/1990 | Harada et al. |
| 4,931,158 A | 6/1990 | Bunshah et al. |
| 4,934,315 A | 6/1990 | Linnebach et al. |
| 4,954,371 A | 9/1990 | Yializis |
| 4,977,013 A | 12/1990 | Ritchie et al. |
| 5,032,461 A | 7/1991 | Shaw et al. |
| 5,036,249 A | 7/1991 | Pike-Biegunski et al. |
| 5,047,131 A | 9/1991 | Wofe et al. |
| 5,059,861 A | 10/1991 | Littman et al. |
| 5,124,204 A | 6/1992 | Yamashita et al. |
| 5,189,405 A | 2/1993 | Yamashita et al. |
| 5,203,898 A | 4/1993 | Carpenter et al. |
| 5,204,314 A | 4/1993 | Kirlin et al. |
| 5,237,439 A | 8/1993 | Misono et al. |
| 5,260,095 A | 11/1993 | Affinito |
| 5,336,324 A | 8/1994 | Stall et al. |
| 5,354,497 A | 10/1994 | Fukuchi et al. |
| 5,356,947 A | 10/1994 | Ali et al. |
| 5,357,063 A | 10/1994 | House et al. |
| 5,376,467 A | 12/1994 | Abe Takao et al. |
| 5,393,607 A | 2/1995 | Kawasaki et al. |
| 5,395,644 A | 3/1995 | Affinito |
| 5,402,314 A | 3/1995 | Amago et al. |
| 5,427,638 A | 6/1995 | Goetz et al. |
| 5,440,446 A | 8/1995 | Shaw et al. |
| 5,451,449 A | 9/1995 | Shetty et al. |
| 5,461,545 A | 10/1995 | Leroy et al. |
| 5,464,667 A | 11/1995 | Kohler et al. |
| 5,510,173 A | 4/1996 | Pass et al. |
| 5,512,320 A | 4/1996 | Turner et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,652,192 A | 7/1997 | Matson et al. |
| 5,654,084 A | 8/1997 | Egert |
| 5,660,961 A | 8/1997 | Yu |
| 5,665,280 A | 9/1997 | Trophsa |
| 5,681,615 A | 10/1997 | Affinito et al. |
| 5,681,666 A | 10/1997 | Treger et al. |
| 5,684,084 A | 11/1997 | Lewin et al. |
| 5,686,360 A * | 11/1997 | Harvey et al. .................. 438/28 |
| 5,693,956 A | 12/1997 | Shi et al. |
| 5,695,564 A | 12/1997 | Imahashi |
| 5,711,816 A | 1/1998 | Kirlin et al. |
| 5,725,909 A | 3/1998 | Shaw et al. |
| 5,731,661 A | 3/1998 | So et al. |
| 5,736,207 A | 4/1998 | Walther et al. |
| 5,747,182 A | 5/1998 | Friend et al. |
| 5,757,126 A | 5/1998 | Harvey, III et al. |
| 5,759,329 A | 6/1998 | Krause et al. |
| 5,771,177 A | 6/1998 | Tada et al. |
| 5,771,562 A | 6/1998 | Harvey, III et al. |
| 5,782,355 A | 7/1998 | Katagiri et al. |
| 5,792,550 A | 8/1998 | Phillips et al. |
| 5,795,399 A | 8/1998 | Hasegawa et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,861,658 A | 1/1999 | Cronin et al. |
| 5,869,791 A | 2/1999 | Young |
| 5,872,355 A | 2/1999 | Hueschen |
| 5,891,554 A | 4/1999 | Hosokawa et al. |
| 5,895,228 A | 4/1999 | Biebuyck et al. |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,919,328 A | 7/1999 | Tropsha et al. |
| 5,920,080 A | 7/1999 | Jones |
| 5,922,161 A | 7/1999 | Wu et al. |
| 5,929,562 A | 7/1999 | Pichler |
| 5,934,856 A | 8/1999 | Asakawa et al. |
| 5,945,174 A | 8/1999 | Shaw et al. |
| 5,948,552 A | 9/1999 | Antoniadis et al. |
| 5,952,778 A | 9/1999 | Haskal et al. |
| 5,955,161 A | 9/1999 | Tropsha |
| 5,965,907 A | 10/1999 | Huang et al. |
| 5,968,620 A | 10/1999 | Harvey et al. |
| 5,994,174 A | 11/1999 | Carey et al. |
| 5,996,498 A | 12/1999 | Lewis |
| 6,004,660 A | 12/1999 | Topolski et al. |
| 6,013,337 A | 1/2000 | Knors |
| 6,040,017 A | 3/2000 | Mikhael et al. |
| 6,045,864 A | 4/2000 | Lyons et al. |
| 6,066,826 A | 5/2000 | Yializis |
| 6,083,313 A | 7/2000 | Venkatraman et al. |
| 6,083,628 A | 7/2000 | Yializis |
| 6,084,702 A | 7/2000 | Byker et al. |
| 6,087,007 A | 7/2000 | Fujii et al. |
| 6,092,269 A | 7/2000 | Yializis et al. |
| 6,106,627 A | 8/2000 | Yializis et al. |
| 6,117,266 A | 9/2000 | Horzel et al. |
| 6,118,218 A | 9/2000 | Yializis et al. |
| 6,146,225 A | 11/2000 | Sheats et al. |
| 6,146,462 A | 11/2000 | Yializis et al. |
| 6,150,187 A | 11/2000 | Zyung et al. |
| 6,165,566 A | 12/2000 | Tropsha |
| 6,178,082 B1 | 1/2001 | Farooq et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |

(56) References Cited

U.S. PATENT DOCUMENTS

| | | | |
|---|---|---|---|
| 6,231,939 B1 | 5/2001 | Shaw et al. |
| 6,264,747 B1 | 7/2001 | Shaw et al. |
| 6,268,695 B1 | 7/2001 | Affinito |
| 6,274,204 B1 | 8/2001 | Affinito |
| 6,322,860 B1 | 11/2001 | Stein et al. |
| 6,333,065 B1 | 12/2001 | Arai et al. |
| 6,348,237 B2 | 2/2002 | Kohler et al. |
| 6,350,034 B1 | 2/2002 | Fleming et al. |
| 6,352,777 B1 | 3/2002 | Bulovic et al. |
| 6,358,570 B1 | 3/2002 | Affinito |
| 6,361,885 B1 | 3/2002 | Chou |
| 6,397,776 B1 | 6/2002 | Yang et al. |
| 6,413,645 B1 | 7/2002 | Graff et al. |
| 6,416,872 B1 | 7/2002 | Maschwitz |
| 6,420,003 B2 | 7/2002 | Shaw et al. |
| 6,436,544 B1 | 8/2002 | Veyrat et al. |
| 6,460,369 B2 | 10/2002 | Hosokawa |
| 6,465,953 B1 | 10/2002 | Duggal |
| 6,468,595 B1 | 10/2002 | Mikhael et al. |
| 6,469,437 B1 | 10/2002 | Parthasarathy et al. |
| 6,492,026 B1 | 12/2002 | Graff et al. |
| 6,497,598 B2 | 12/2002 | Affinito |
| 6,497,924 B2 | 12/2002 | Affinito et al. |
| 6,509,065 B2 | 1/2003 | Affinito |
| 6,512,561 B1 | 1/2003 | Terashita et al. |
| 6,522,067 B1 | 2/2003 | Graff et al. |
| 6,537,688 B2 | 3/2003 | Silvernail et al. |
| 6,544,600 B2 | 4/2003 | Affinito et al. |
| 6,569,515 B2 | 5/2003 | Hebrink et al. |
| 6,570,325 B2 | 5/2003 | Graff et al. |
| 6,573,652 B1 | 6/2003 | Graff et al. |
| 6,576,351 B2 | 6/2003 | Silvernail |
| 6,592,969 B1 | 7/2003 | Burroughes et al. |
| 6,597,111 B2 | 7/2003 | Silvernail et al. |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito et al. |
| 6,664,137 B2 | 12/2003 | Weaver |
| 6,681,716 B2 | 1/2004 | Schaepkens |
| 6,734,625 B2 | 5/2004 | Vong et al. |
| 6,737,753 B2 | 5/2004 | Kumar et al. |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,803,245 B2 | 10/2004 | Auch et al. |
| 6,811,829 B2 | 11/2004 | Affinito et al. |
| 6,815,887 B2 | 11/2004 | Lee et al. |
| 6,818,291 B2 | 11/2004 | Funkenbusch et al. |
| 6,827,788 B2 | 12/2004 | Takahashi |
| 6,835,950 B2 | 12/2004 | Brown et al. |
| 6,836,070 B2 | 12/2004 | Chung et al. |
| 6,837,950 B1 | 1/2005 | Berard |
| 6,852,356 B2 | 2/2005 | Nishikawa |
| 6,864,629 B2 | 3/2005 | Miyaguchi et al. |
| 6,866,901 B2 | 3/2005 | Burrows et al. |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,872,428 B2 | 3/2005 | Yang et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,905,769 B2 | 6/2005 | Komada |
| 6,911,667 B2 | 6/2005 | Pichler et al. |
| 6,936,131 B2 | 8/2005 | McCormick et al. |
| 6,975,067 B2 | 12/2005 | McCormick et al. |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 7,112,351 B2 | 9/2006 | Affinito |
| 7,166,007 B2 | 1/2007 | Auch et al. |
| 7,198,832 B2 | 4/2007 | Burrows et al. |
| 7,221,093 B2 | 5/2007 | Auch et al. |
| 7,255,823 B1 | 8/2007 | Guenther et al. |
| 7,621,794 B2 | 11/2009 | Lee et al. |
| 2001/0015074 A1 | 8/2001 | Hosokawa |
| 2001/0015620 A1 | 8/2001 | Affinito |
| 2002/0022156 A1 | 2/2002 | Bright |
| 2002/0025444 A1 | 2/2002 | Hebgrink et al. |
| 2002/0068143 A1 | 6/2002 | Silvernail |
| 2002/0069826 A1 | 6/2002 | Hunt et al. |
| 2002/0102363 A1 | 8/2002 | Affinito et al. |
| 2002/0102818 A1 | 8/2002 | Sandhu et al. |
| 2002/0125822 A1 | 9/2002 | Graff et al. |
| 2002/0139303 A1 | 10/2002 | Yamazaki et al. |
| 2002/0140347 A1* | 10/2002 | Weaver ........................ 313/506 |
| 2003/0038590 A1 | 2/2003 | Silvernail et al. |
| 2003/0085652 A1 | 5/2003 | Weaver |
| 2003/0098647 A1 | 5/2003 | Silvernail et al. |
| 2003/0124392 A1 | 7/2003 | Bright |
| 2003/0127973 A1 | 7/2003 | Weaver et al. |
| 2003/0184222 A1 | 10/2003 | Nilsson et al. |
| 2003/0197197 A1 | 10/2003 | Brown et al. |
| 2003/0218422 A1 | 11/2003 | Park et al. |
| 2003/0235648 A1 | 12/2003 | Affinito et al. |
| 2004/0018305 A1 | 1/2004 | Pagano et al. |
| 2004/0029334 A1 | 2/2004 | Bijker et al. |
| 2004/0046497 A1 | 3/2004 | Schaepkens et al. |
| 2004/0071971 A1 | 4/2004 | Iacovangelo |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0175512 A1 | 9/2004 | Schaepkens |
| 2004/0175580 A1 | 9/2004 | Schaepkens |
| 2004/0187999 A1 | 9/2004 | Wilkinson et al. |
| 2004/0209090 A1 | 10/2004 | Iwanaga |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0051094 A1 | 3/2005 | Schaepkens et al. |
| 2005/0079295 A1 | 4/2005 | Schaepkens |
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095422 A1 | 5/2005 | Sager et al. |
| 2005/0095736 A1 | 5/2005 | Padiyath et al. |
| 2005/0112378 A1 | 5/2005 | Naruse et al. |
| 2005/0122039 A1 | 6/2005 | Satani |
| 2005/0129841 A1 | 6/2005 | McCormick et al. |
| 2005/0133781 A1 | 6/2005 | Yan et al. |
| 2005/0140291 A1 | 6/2005 | Hirakata et al. |
| 2005/0146267 A1 | 7/2005 | Lee et al. |
| 2005/0174045 A1 | 8/2005 | Lee et al. |
| 2005/0176181 A1 | 8/2005 | Burrows et al. |
| 2005/0212419 A1 | 9/2005 | Vazan et al. |
| 2005/0224935 A1 | 10/2005 | Schaepkens et al. |
| 2005/0238846 A1 | 10/2005 | Arakatsu et al. |
| 2005/0239294 A1 | 10/2005 | Rosenblum et al. |
| 2006/0003474 A1 | 1/2006 | Tyan et al. |
| 2006/0006799 A1 | 1/2006 | Yamazaki et al. |
| 2006/0028128 A1 | 2/2006 | Ohkubo |
| 2006/0061272 A1 | 3/2006 | McCormick et al. |
| 2006/0062937 A1 | 3/2006 | Padiyath et al. |
| 2006/0063015 A1 | 3/2006 | McCormick et al. |
| 2006/0216951 A1 | 9/2006 | Moro et al. |
| 2006/0246811 A1 | 11/2006 | Winters et al. |
| 2006/0250084 A1 | 11/2006 | Cok et al. |

(56) References Cited

U.S. PATENT DOCUMENTS

| | | |
|---|---|---|
| 2007/0009674 A1 | 1/2007 | Okubo et al. |
| 2008/0032076 A1 | 2/2008 | Dujardin et al. |
| 2009/0258235 A1 | 10/2009 | Tateishi |

FOREIGN PATENT DOCUMENTS

| | | |
|---|---|---|
| DE | 196 03 746 A1 | 4/1997 |
| DE | 696 15 510 T2 | 6/1997 |
| DE | 10 2004 063 619 A1 | 7/2006 |
| EP | 0 147 696 B1 | 7/1985 |
| EP | 0 299 753 A2 | 1/1989 |
| EP | 0 340 935 A2 | 11/1989 |
| EP | 0 390 540 B1 | 10/1990 |
| EP | 0 468 440 A2 | 1/1992 |
| EP | 0 547 550 A1 | 6/1993 |
| EP | 0 590 467 A1 | 4/1994 |
| EP | 0 611 037 A1 | 8/1994 |
| EP | 0 722 787 A2 | 7/1996 |
| EP | 0 777 280 A2 | 6/1997 |
| EP | 0 777 281 A2 | 6/1997 |
| EP | 0 787 824 A2 | 8/1997 |
| EP | 0 787 826 A1 | 8/1997 |
| EP | 0 915 105 A1 | 5/1999 |
| EP | 0 916 394 A2 | 5/1999 |
| EP | 0 931 850 A1 | 7/1999 |
| EP | 0 977 469 A2 | 2/2000 |
| EP | 1 021 070 A1 | 7/2000 |
| EP | 1 127 381 | 8/2001 |
| EP | 1 130 420 A2 | 9/2001 |
| EP | 1 278 244 A2 | 1/2003 |
| EP | 1514317 A1 | 3/2005 |
| EP | 1 719 808 A2 | 11/2006 |
| EP | 1 857 270 A1 | 11/2007 |
| GB | 2 210 826 A | 6/1989 |
| JP | 63-96895 | 4/1988 |
| JP | 63136316 | 6/1988 |
| JP | 64-41192 | 2/1989 |
| JP | 01041067 | 2/1989 |
| JP | 02183230 | 7/1990 |
| JP | 3-183759 | 8/1991 |
| JP | 03290375 | 12/1991 |
| JP | 4-14440 | 1/1992 |
| JP | 4-48515 | 2/1992 |
| JP | 04267097 | 9/1992 |
| JP | 0615305 | 11/1992 |
| JP | 5501587 | 3/1993 |
| JP | 5-147678 | 6/1993 |
| JP | 05182759 | 7/1993 |
| JP | 5290972 | 11/1993 |
| JP | 06-136159 | 5/1994 |
| JP | 61-79644 | 6/1994 |
| JP | 06-196260 | 7/1994 |
| JP | 06-223966 | 8/1994 |
| JP | 6234186 A | 8/1994 |
| JP | 07147189 | 6/1995 |
| JP | 07192866 | 7/1995 |
| JP | 8-72188 | 3/1996 |
| JP | 08171988 | 7/1996 |
| JP | 08179292 | 7/1996 |
| JP | 08-203669 | 8/1996 |
| JP | 8-318590 | 12/1996 |
| JP | 08325713 | 12/1996 |
| JP | 09059763 | 4/1997 |
| JP | 09132774 | 5/1997 |
| JP | 09161967 | 6/1997 |
| JP | 9-201897 | 8/1997 |
| JP | 10-725 | 1/1998 |
| JP | 10-013083 | 1/1998 |
| JP | 10312883 | 11/1998 |
| JP | 11040344 | 2/1999 |
| JP | 11-149826 | 6/1999 |
| JP | 11255923 | 9/1999 |
| JP | 2003282239 A | 10/2003 |
| WO | 87/07848 | 12/1987 |
| WO | 89/00337 | 1/1989 |
| WO | 91/07519 A1 | 5/1991 |
| WO | 95/10117 | 4/1995 |
| WO | 96/23217 | 8/1996 |
| WO | 97/04885 | 2/1997 |
| WO | 97/16053 | 5/1997 |
| WO | 97/22631 | 6/1997 |
| WO | 98/10116 | 3/1998 |
| WO | 98/18852 | 5/1998 |
| WO | 99/16557 | 4/1999 |
| WO | 99/16931 | 4/1999 |
| WO | 99/33651 A1 | 7/1999 |
| WO | 99/46120 | 9/1999 |
| WO | 00/26973 | 5/2000 |
| WO | 00/35603 | 6/2000 |
| WO | 00/35604 | 6/2000 |
| WO | 00/35993 | 6/2000 |
| WO | 00/36661 | 6/2000 |
| WO | 00/36665 | 6/2000 |
| WO | 2004/089620 A2 | 10/2001 |
| WO | 01/81649 A1 | 11/2001 |
| WO | 01/82336 A2 | 11/2001 |
| WO | 01/82389 A1 | 11/2001 |
| WO | 01/87825 A1 | 11/2001 |
| WO | 01/89006 A1 | 11/2001 |
| WO | 02/26973 A1 | 4/2002 |
| WO | 02/051626 A1 | 7/2002 |
| WO | 02071506 A1 | 9/2002 |
| WO | 03/016589 A1 | 2/2003 |
| WO | 03/098716 A1 | 11/2003 |
| WO | 2004/006199 A3 | 1/2004 |
| WO | 2004/016992 A1 | 2/2004 |
| WO | 2004/070840 A1 | 8/2004 |
| WO | 2005/015655 A1 | 2/2005 |
| WO | 2005/045947 A2 | 5/2005 |
| WO | 2005/048368 A1 | 5/2005 |
| WO | 2006/036492 A1 | 4/2006 |
| WO | 2006/093898 A1 | 9/2006 |
| WO | 2008097297 A2 | 8/2008 |
| WO | 2008097297 A3 | 8/2008 |
| WO | 2008097297 A9 | 8/2008 |
| WO | 2008/144080 A1 | 11/2008 |

OTHER PUBLICATIONS

Wong, C.P., Recent Advanced in IC Passivation and Encapsulation: Process Techniques and Materials; Polymers for Electronic and Photonic Applications; At&T Bell Laboratories, 1993, pp. 167-209.

Shi, M.K., et al., In-Situ And Real-Time Monitoring of Plasma-Induced Etching PET and Acrylic Films, Plasma and Polymers, Dec. 1999, 4(4), pp. 1-25.

Affinito, J.D., et al., Vacuum Deposited Polymer/Metal Multilayer Films for Optical Applications; Paper No. C1.13; International Conference on Metallurgical Coatings; Apr. 15-21, 1995, pp. 1-14.

Affinito, J.D., et al., Vacuum Deposition of Polymer Electrolytes on Flexible Substrates, Proceedings in the Ninth International Conference on Vacuum Web Coating, Nov. 1995, edited by R. Bakish, Bakish Press 1995, pp. 20-36.

PCT International Search Report, Application No. PCT/US99/29853 dated Mar. 3, 2000.

Yializis A., et al., Ultra High Barrier Films, 43rd Annual Technical Conference Proceedings, Denver, CO, Apr. 15-20, 2000, pp. 404-407.

Henry, B.M., et al., Microstructural and Gas Barrier Properties of Transparent Aluminum Oxide and Indium Tin Oxide Films, 43rd Annual Technical Conference Proceedings, Denver, CO, Apr. 15-20, 2000, pp. 373-378.

Affinito, J.D., et al., Vacuum Deposition of Polymer Electrolytes on Flexible Substrates, The Ninth International Conference on Vacuum Web Coatings, 1995, pp. 0-16.

Norenberg, H., et al., Comparative Study of Oxygen Permeation Through Polymers and Gas Barrier Films, 43rd Annual Technical Conference Proceedings, Denver, CO., Apr. 15-20, 2000, pp. 347-351.

Mahon, J.K., et al., Requirements of Flexible Substrates for Organic Light Emitting Devices in Flat Panel Display Applications; Society of Vacuum Coaters, 42nd Annual Technical Conference Proceedings, Apr. 1999, pp. 456-459.

(56) References Cited

OTHER PUBLICATIONS

Tropsha et al., Activated Rate Theory Treatment of Oxygen and Water Transport through Silicon Oxide/Poly (ethylene terphthalate) Composite Barrier Structures; J. Phys. Chem B Mar. 1997; pp. 225-2266.

Tropsha et al., Combinatorial Barrier Effect of the Multilayer SiOx Coatings on Polymer Substrates; Society of Vacuum Coaters; 40th Annual Technical Conferences Proceedings; Apr. 12-17, 1997, pp. 64-69.

Affinito, J.D., et al., Ultra High Rate, Wide Area, Plasma Polymerized Films from High Molecular Weight/Low Vapor Pressure Liquid or Solid Monomer Precursors; 45th International Symposium of the American Vacuum Society, Nov. 2-6, 1998; pp. 0-26.

Felts, J.T., Transparent Barrier Coatings Update: Flexible Substrates; 36th Annual Technical Conference Proceedings; Apr. 25-30, 1993, pp. 324-331.

Affinito, J.D., et al., Molecularly Doped Polymer Composite Films for Light Emitting Polymer Application Fabricated by the Pml Process, 41st Technical Conference of the Society of Vacuum Coaters; Apr. 1998, pp. 220-225.

Affinito, J.D., et al., Vacuum Deposited Conductive Polymer Films; The 11st International Conference on Vacuum Web Coating, Nov. 9-11, 1997, pp. 0-12.

Affinito, J.D., et al., Polymer/Polymer, Polymer/Oxide, and Polymer/Metal Vacuum Deposited Interferences Filters; 10th International Vacuum Web Coating Conference, Nov. 1996, pp. 0-14.

Kukla, R., et al., Transparent Barrier Coatings with EB-Evaporation, an Update; Section Five; Transparent Barrier Coating Papers; Thirteenth International Conference on Vacuum Web Coatings; Oct. 17-19, 1999, pp. 222-233.

Bright, Clark I., Transparent Barrier Coatings Based on ITO for Flexible Plastic Displays; Thirteenth International Conference on Vacuum Web Coatings, Oct. 17-19, 1999, pp. 247-255.

Henry, B.M., et al., Microstructural Studies of Transparent Gas Barrier Coatings on Polymer Substrates; Thirteenth International Conference on Vacuum Web Coatings; Oct. 17-19, 1999, pp. 265-273.

Hibino, N., et al., Transparent Barrier A12O3 Coating by Activated Reactive Evaporation; Thirteenth International Conference on Vacuum Web Coatings, Oct. 17-19, 1999, pp. 234-245.

Shi, M.K., et al., Plasma Treatment of PET and Acrylic Coating Surfaces-I. In situ XPS Measurements; Journal of Adhesion Science and Technology, Mar. 2000, 14(12); pp. 1-28.

Affinito, J.D., et al., PML/Oxide/PML Barrier Layer Performance Differences Arising From Use of UV or Electron Beam Polymerization of the PML Layers, SVC 40th Annual Technical Conference, Apr. 12-17, 1997; pp. 19-25.

Yializis, A., et al., High Oxygen Barrier Polypropylene Films Using Transparent Acrylate-A2O3 and Opaque Al-Acrylate Coatings; Society of Vacuum Coaters, 1995, pp. 95-102.

Shaw, D.G., et al., Use of Vapor Deposited Acrylate Coatings to Improve the Barrier Properties of Metallized Film; Society of Vacuum Coaters, 1994, pp. 240-244.

Affinito, J.D., et al., Vacuum Deposited Conductive Polymer Films, the 11th International Conference on Vacuum Web Coating, no earlier than Feb. 1998, pp. 200-213.

Bunshah, R.F., et al., Deposition Technologies for Films and Coatings, Noyes Publications, Park Ridge, New Jersey, 1982, p. 339.

Affinito, J.D., Energy Res. Abstract 18(6), #17171, 1993.

Atsuhisa Inoue, et al., Fabrication of a Thin Film of MNA by Vapour Deposition, Proc. of the 33rd Japan Conference on Materials Research, U.33, pp. 177-179, 1990.

Affinito, J.D., et al., Ultrahigh Rate, Wide Area, Plasma Polymerized Films from High Molecular Weight/Low Vapor Pressure Liquid or Solid Monomer Precursors; American Vacuum Society, Journal Vacuum Science Technology A 17 (4), Jul./Aug. 1999, pp. 1974-1982.

Graupner, W., et al., High Resolution Color Organic Light Emitting Diode Microdisplay Fabrication Method, SPIE Proceedings, Nov. 6, 2000, pp. 11-19.

Czeremuszkin, G., et al., Permeation Through Defects in Transparent Barrier Coated Plastic Films, 43rd Annual Technical Conference Proceedings, Apr. 15, 2000, pp. 408-413.

Vossen, J.L., et al., Thin Film Processes; Academic Press, 1978, Part II, Chapter 11-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.

Gustafason, G., et al., Flexible Light-Emitting Diodes Made from Soluble Conducting Polymers; Letters to Nature, vol. 357, Jun. 11, 1992, pp. 477-479.

Penning, F.M., Electrical Discharges in Gases; 1965, pp. 1-51; Gordon and Breach, Science Publishers, New York-London-Paris.

Affinito, J.D., et al., High Rate Vacuum Deposition of Polymer Electrolytes; Journal Vacuum Science Technology A 14(3), May/Jun. 1996.

Phillips, R.W., Evaporated Dielectric Colorless Films on PET and OPP Exhibiting High Barriers Toward Moisture and Oxygen; Society of Vacuum Coaters; 36th Annual Technical Conference Proceedings; 1993; pp. 293-301.

Yamada, Y., et al., The Properties of a New Transparent and Colorless Barrier Film, Society of Vacuum Coaters, 1995, pp. 28-31.

Chahroudi, D., Transparent Glass Barrier Coatings for Flexible Film Packaging; Society of Vacuum Coaters, 1991; pp. 130-133.

Krug, T., et al., New Developments in Transparent Barrier Coatings, Society of Vacuum Coaters, 1993, pp. 302-305.

Affinito, J.D., et al., A New Method for Fabricating Transparent Barrier Layers, Thin Solid Film 290-291, 1996, pp. 63-37.

Affinito, J.D., et al., Polymer-Oxide Transparent Barrier Layers, SVC 39th Annual Technical Conference; Vacuum Web Coating Session, 1996, pp. 392-397.

Hoffman, G., et al., Transparent Barrier Coatings by Reactive Evaporation; Society of Vacuum Coaters, 1994, pp. 155-160.

Klemberg-Sapieha, J.E., et al., Transparent Gas Barrier Coatings Produced by Dual-Frequency PECVD: Society of Vacuum Coaters, 1993, pp. 445-449.

Finson, E., et al., Transparent SiO2 Barrier Coatings: Conversion of Production Status; Society of Vacuum Coaters, 1994, pp. 139-143.

Affinito, J.D., et al., Ultra High Rate, Wide Area, Plasma Polymerized Films From High Molecular Weight/Low Vapor Pressure Liquid or Liquid/Solid Suspension Monomer Precursors; MRS Conference, Nov. 29, 1998-Dec. 3, 1998, Paper No. Y12.1.

Chwang et al., Thin Film Encapsulated Flexible Organic Electroluminescent Displays, Applied Physics Letter, vol. 83, No. 3, Jul. 21, 2003, pp. 413-415.

Akedo et al., Plasma-CVD SiNx/Plasma-Polymerized Cnx:H Multilayer Passivation Films from Organic Light Emitting Diodes, Society of Information Display Digest of Technical Papers, vol. 34, No. 1, May 1, 2003, pp. 559-561.

Advisory Action of U.S. Appl. No. 10/412,133 dated Apr. 8, 2008.
Advisory Action of U.S. Appl. No. 10/412,133 dated Aug. 8, 2008.
Advisory Action of U.S. Appl. No. 11/112,880 dated Jul. 23, 2009.
Advisory Action of U.S. Appl. No. 11/693,022 dated Oct. 21, 2009.
Election/Restrictions Requirement of U.S. Appl. No. 10/412,133 dated Dec. 28, 2004.
Election/Restrictions Requirement of U.S. Appl. No. 11/112,880 dated Jul. 25, 2008.
Election/Restrictions Requirement of U.S. Appl. No. 11/693,020 dated Aug. 8, 2008.
Election/Restrictions Requirement of U.S. Appl. No. 11/693,022 dated Oct. 7, 2008.
Advisory Action of U.S. Appl. No. 11/068,356 dated Feb. 12, 2008.
Election/Restrictions Requirement of U.S. Appl. No. 11/693,020 dated Jun. 25, 2009.
Election/Restrictions Requirement of U.S. Appl. No. 11/509,837 dated Mar. 4, 2009.
Notice of Allowance of U.S. Appl. No. 11/776,616 dated Sep. 18, 2009.
Office Action of U.S. Appl. No. 11/693,022 dated Jan. 23, 2009.
Office Action of U.S. Appl. No. 10/412,133 dated Mar. 3, 2006.
Office Action of U.S. Appl. No. 10/412,133 dated Mar. 28, 2005.
Office Action of U.S. Appl. No. 11/112,880 dated May 28, 2009.
Advisory Action of U.S. Appl. No. 11/068,356 dated Mar. 30, 2009.
Office Action of U.S. Appl. No. 11/693,022 dated Aug. 18, 2009.

(56) References Cited

OTHER PUBLICATIONS

Office Action of U.S. Appl. No. 10/412,133 dated Sep. 5, 2007.
Office Action of U.S. Appl. No. 10/412,133 dated Sep. 7, 2006.
Office Action of U.S. Appl. No. 11/776,616 dated Sep. 26, 2008.
Office Action of U.S. Appl. No. 10/412,133 dated Nov. 3, 2005.
Office Action of U.S. Appl. No. 11/112,880 dated Dec. 3, 2008.
Office Action of U.S. Appl. No. 10/412,133 dated Dec. 11, 2007.
Office Action of U.S. Appl. No. 11/693,020 dated Dec. 30, 2008.
Election/Restrictions Requirement of U.S. Appl. No. 11/068,356 dated Oct. 17, 2008.
Office Action of U.S. Appl. No. 11/068,356 dated Jan. 22, 2009.
Office Action of U.S. Appl. No. 11/068,356 dated Apr. 4, 2008.
Office Action of U.S. Appl. No. 11/068,356 dated Jun. 10, 2009.
Office Action of U.S. Appl. No. 11/068,356 dated Jun. 15, 2007.
Office Action of U.S. Appl. No. 11/068,356 dated Nov. 28, 2007.
Office Action of U.S. Appl. No. 11/509,837 dated Jun. 30, 2009.
Advisory Action of U.S. Appl. No. 11/693,020 dated Dec. 15, 2009.
Election/Restrictions Requirement of U.S. Appl. No. 11/509,837 dated Dec. 14, 2009.
Examiner's Answer of U.S. Appl. No. 10/412,133 dated Nov. 12, 2009.
Office Action of U.S. Appl. No. 11/068,356 dated Dec. 7, 2009.
Office Action of U.S. Appl. No. 11/627,583 dated Dec. 1, 2009.
Office Action of U.S. Appl. No. 11/693,020 dated Oct. 29, 2009.
Election/Restrictions Requirement of U.S. Appl. No. 12/345,912 dated Oct. 27, 2009.
Notice of Allowance of U.S. Appl. No. 11/693,022 dated Dec. 29, 2009.
International Search Report and Written Opinion pertaining to International Appl. No. PCT/US2009/060437 dated Feb. 17, 2010.
International Search Report and Written Opinion pertaining to International Appl. No. PCT/US2009/066518 dated Feb. 15, 2010.
Japanese Office Action pertaining to Japanese Patent Appl. No. 2003-586919 dated Dec. 16, 2009.
Chinese Office Action pertaining to Chinese Patent Appl. No. 200580049572.8 dated Jan. 28, 2010.
Notice of Allowance of U.S. Appl. No. 11/693,022 dated Jan. 28, 2010.
Wong, et al., Long-Lifetime Thin-Film Encapsulated Organic Light-Emitting Diodes, Journal of Applied Physics 104, 014509 (2008), pp. 104-107, American Institute of Physics, USA.

\* cited by examiner

METHOD FOR EDGE SEALING BARRIER FILMS

CROSS-REFERENCE TO RELATED APPLICATIONS

This application is a division of U.S. patent application Ser. No. 11/068,356, filed Feb. 28, 2005, and entitled "METHOD FOR EDGE SEALING BARRIER FILMS", now abandoned, which is a division of U.S. patent application Ser. No. 09/966,163, filed Sep. 28, 2001, and entitled "METHOD FOR EDGE SEALING BARRIER FILMS" now U.S. Pat. No. 6,866,901, issued Mar. 15, 2005 which is a continuation-in-part of U.S. patent application Ser. No. 09/427,138, filed Oct. 25, 1999, entitled "ENVIRONMENTAL BARRIER MATERIAL FOR ORGANIC LIGHT EMITTING DEVICE AND METHOD OF MAKING," now U.S. Pat. No. 6,522,067, issued Feb. 18, 2003.

BACKGROUND OF THE INVENTION

The invention relates generally to multilayer, thin film barrier composites, and more particularly, to multilayer, thin film barrier composites having the edges sealed against lateral moisture and gas diffusion.

Multilayer, thin film barrier composites having alternating layers of barrier material and polymer material are known. These composites are typically formed by depositing alternating layers of barrier material and polymer material, such as by vapor deposition. If the polymer layers are deposited over the entire surface of the substrate, then the edges of the polymer layers are exposed to oxygen, moisture, and other contaminants. This potentially allows the moisture, oxygen, or other contaminants to diffuse laterally into an encapsulated environmentally sensitive device from the edge of the composite, as shown in FIG. 1. The multilayer, thin film barrier composite 100 includes a substrate 105 and alternating layers of decoupling material 110 and barrier material 115. The scale of FIG. 1 is greatly expanded in the vertical direction. The area of the substrate 105 will typically vary from a few square centimeters to several square meters. The barrier layers 115 are typically a few hundred Angstroms thick, while the decoupling layers 110 are generally less than ten microns thick. The lateral diffusion rate of moisture and oxygen is finite, and this will eventually compromise the encapsulation. One way to reduce the problem of edge diffusion is to provide long edge diffusion paths. However, this decreases the area of the substrate which is usable for active environmentally sensitive devices. In addition, it only lessens the problem, but does not eliminate it.

A similar edge diffusion problem will arise when a substrate containing a multilayer, thin film barrier composite is scribed and separated to create individual components.

Thus, there is a need for a edge-sealed barrier film composite, and for a method of making such a composite.

SUMMARY OF THE INVENTION

The present invention solves this need by providing an edge-sealed barrier film composite. The composite comprises a substrate, and at least one initial barrier stack adjacent to the substrate, the at least one initial barrier stack comprising at least one decoupling layer and at least one barrier layer, wherein a first decoupling layer has an area and wherein a first barrier layer has an area, the area of the first barrier layer being greater than the area of the first decoupling layer, and wherein the first decoupling layer is sealed by the first barrier layer within the area of the first barrier layer. By adjacent, we mean next to, but not necessarily directly next to. There can be additional layers intervening between the substrate and the barrier stacks.

The first layer can be either a decoupling layer or a barrier layer, as can the last layer. One or more barrier stacks can include at least two decoupling layers and/or at least two barrier layers. When a barrier stack has at least two barrier layers, a second barrier layer may have an area greater than the area of the first decoupling layer, and the first and second barrier layers may seal the first decoupling layer between them.

The decoupling layers can be made from materials including, but not limited to, organic polymers, inorganic polymers, organometallic polymers, hybrid organic/inorganic polymer systems, silicates, and combinations thereof. The decoupling layers can be made of the same decoupling material or different decoupling materials.

Suitable barrier materials include, but are not limited to, metals, metal oxides, metal nitrides, metal carbides, metal oxynitrides, metal oxyborides, and combinations thereof. Suitable barrier materials also include, but are not limited to, opaque metals, opaque ceramics, opaque polymers, and opaque cermets, and combinations thereof. The barrier layers can be made of the same barrier material or different barrier material.

The composite can include an environmentally sensitive device. Environmentally sensitive devices include, but are not limited to, organic light emitting devices, liquid crystal displays, displays using electrophoretic inks, light emitting diodes, light emitting polymers, electroluminescent devices, phosphorescent devices, electrophoretic inks, organic solar cells, inorganic solar cells, thin film batteries, and thin film devices with vias, and combinations thereof.

Another aspect of the invention is an edge-sealed, encapsulated environmentally sensitive device. The edge-sealed, encapsulated environmentally sensitive device includes: at least one initial barrier stack comprising at least one decoupling layer and at least one barrier layer, wherein a first decoupling layer of a first initial barrier stack has an area and wherein a first barrier layer of the first initial barrier stack has an area, the area of the first barrier layer of the first initial barrier stack being greater than the area of the first decoupling layer of the first initial barrier stack, and wherein the first decoupling layer of the first initial barrier stack is sealed by the first barrier layer of the first initial barrier stack within the area of the first barrier layer; an environmentally sensitive device adjacent to the at least one initial barrier stack; and at least one additional barrier stack adjacent to the environmentally sensitive device on a side opposite the at least one initial barrier stack, the at least one additional barrier stack comprising at least one decoupling layer and at least one barrier layer, wherein a first decoupling layer of a first additional barrier stack has an area and wherein a first barrier layer of the first additional barrier stack has an area, the area of the first barrier layer of the first additional barrier stack being greater than the area of the first decoupling layer of the first additional barrier stack, wherein the first decoupling layer of the first additional barrier stack is sealed by the first barrier layer of the first additional barrier stack within the area of the first barrier layer, and wherein the environmentally sensitive device is sealed between the at least one initial barrier stack and the at least one additional barrier stack.

Another aspect of the invention is a method of making an edge-sealed barrier film composite. The method includes providing a substrate, and placing at least one initial barrier stack adjacent to the substrate, the at least one initial barrier stack comprising at least one decoupling layer and at least one barrier layer, wherein a first decoupling layer of a first initial barrier stack has an area and wherein a first barrier layer of the first initial barrier stack has an area, the area of the first barrier layer being greater than the area of the first decoupling layer, and wherein the first decoupling layer is sealed by the first barrier layer within the area of the first barrier layer.

Placing the at least one barrier stack adjacent to the substrate includes, but is not limited to, depositing the at least one barrier stack adjacent to the substrate, and laminating the at least one barrier stack adjacent to the substrate.

The barrier layers can be deposited before or after the decoupling layers, depending on the particular application and structure.

Depositing the at least one barrier stack may include, but is not limited to, providing a mask with at least one opening, depositing the first decoupling layer through the at least one opening in the mask, and depositing the first barrier layer.

Alternatively, depositing the at least one barrier stack adjacent to the substrate may include, but is not limited to, depositing the first decoupling layer having an initial area of decoupling material which is greater than the area of the first decoupling layer, etching the first decoupling layer having the initial area of decoupling material to remove a portion of the decoupling material so that the first decoupling layer has the area of the first decoupling layer, and depositing the first barrier layer. Etching the first decoupling layer may include, but is not limited to, providing a solid mask over the first decoupling layer having the initial area of decoupling material, and etching the first decoupling layer having the initial area of decoupling material to remove the portion of the decoupling material outside the solid mask so that the first decoupling layer has the area of the first decoupling layer. The first decoupling layer may be etched so that at least one edge of the first decoupling layer has a gradual slope. A reactive plasma may be used to etch the decoupling layers. Reactive plasmas include, but are not limited to $O_2$, $CF_4$, $H_2$, and combinations thereof.

The method may include placing an environmentally sensitive device adjacent to the substrate before the at least one initial barrier stack is placed thereon. Alternatively, the method may include placing the environmentally sensitive device adjacent to the at least one initial barrier stack after the at least one initial barrier stack is placed on the substrate. The method may also include placing at least one additional barrier stack adjacent to the environmentally sensitive device on a side opposite the substrate, the at least one additional barrier stack comprising at least one decoupling layer and at least one barrier layer, wherein a first decoupling layer of a first additional barrier stack has an area and wherein a first barrier layer of the first additional barrier stack has an area, the area of the first barrier layer of the first additional barrier stack being greater than the area of the first decoupling layer of the first additional barrier stack, and wherein the first decoupling layer of the first additional barrier stack is sealed by the first barrier layer of the first additional barrier stack within the area of the first barrier layer.

Laminating the at least one barrier stack adjacent to the substrate may be performed using a number of processes including, but not limited to, heat, solder, adhesive, ultrasonic welding, and pressure.

The method may include depositing a ridge on the substrate before depositing the at least one barrier stack adjacent to the substrate, the ridge interfering with the deposition of the first decoupling layer so that the area of the first barrier layer is greater than the area of the first decoupling layer and the first decoupling layer is sealed by the first barrier layer within the area of the first barrier layer.

DETAILED DESCRIPTION OF THE INVENTION

Figure 1:
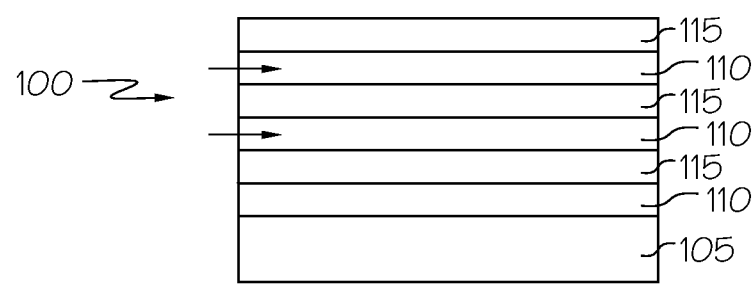
FIG. 1 is a cross-section of a barrier composite of the prior art.
Figure 2:
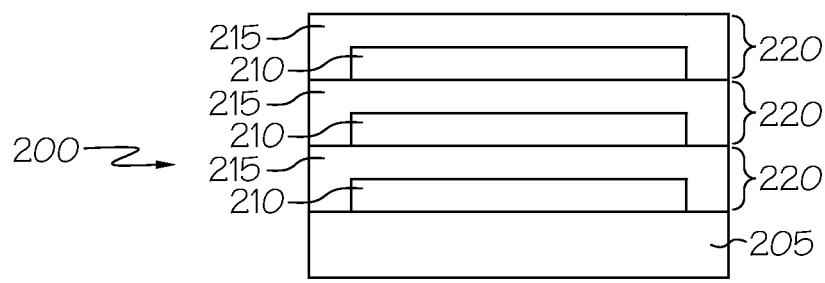
FIG. 2 is a cross-section of one embodiment of an edge-sealed, barrier composite of the present invention.

FIG. 2 shows one embodiment of an edge-sealed, barrier composite 200. The composite 200 includes a substrate 205. The substrate can be any suitable substrate, and can be either rigid or flexible. Suitable substrates include, but are not limited to: polymers, for example, polyethylene terephthalate (PET), polyethylene naphthalate (PEN), or high temperature polymers, such as polyether sulfone (PES), polyimides, or Transphan™ (a high glass transition temperature cyclic olefin polymer available from Lofo High Tech Film, GMBH of Weil am Rhein, Germany); metals and metal foils; paper; fabric; glass, including thin, flexible, glass sheet (for example, flexible glass sheet available from Corning Inc. under the glass code 0211. This particular thin, flexible glass sheet has a thickness of less than 0.6 mm and will bend at a radium of about 8 inches.); ceramics; semiconductors; silicon; and combinations thereof.

FIG. 2 shows three initial barrier stacks 220 adjacent to the substrate 205. The initial barrier stacks 220 include a decoupling layer 210 and a barrier layer 215. The barrier layer 215 has an area greater than the area of the decoupling layer 210. As a result, the barrier layer 215 extends beyond the edges of the decoupling layer 210, sealing the decoupling layer 210 within the area covered by the barrier layer 215. Because the decoupling layers 210 are sealed within the area covered by the barrier layers 215, ambient moisture, oxygen, and other contaminants cannot diffuse through the decoupling layers to the environmentally sensitive device.

FIG. 2 shows three initial barrier stacks 220. However, the number of barrier stacks is not limited. The number of barrier stacks needed depends on the substrate material used and the level of permeation resistance needed for the particular application. One or two barrier stacks may provide sufficient barrier properties for some applications. The most stringent applications may require five or more barrier stacks.

Each of the initial barrier stacks 220 shown in FIG. 2 has one barrier layer 215 and one decoupling layer 210. However, the barrier stacks can have one or more decoupling layers and one or more barrier layers. There could be one decoupling layer and one barrier layer, there could be one or more decoupling layers on one side of one or more barrier layers, there could be one or more decoupling layers on both sides of one or more barrier layers, or there could be one or more barrier layers on both sides of one or more decoupling layers. The important feature is that the barrier stack have at least one decoupling layer and at least one barrier layer. The barrier layers in the barrier stacks can be made of the same material or of a different material, as can the decoupling layers. The barrier layers are typically about 100-400 Å thick, and the decoupling layers are typically about 1000-10,000 Å thick.

Although the three initial barrier stacks 220 are shown as having the same layers in the same order, this is not necessary. The barrier stacks can have the same or different layers, and the layers can be in the same or different sequences.

If there is only one barrier stack and it has only one decoupling layer and one barrier layer, then the decoupling layer must be first in order for the barrier layer to seal it, as shown in FIG. 2. The decoupling layer will be sealed between the substrate (or the upper layer of the previous barrier stack) and the barrier layer. Although a composite can be made with a single barrier stack having one decoupling layer and one barrier layer, there will typically be at least two barrier stacks, each having one (or more) decoupling layer and one (or more) barrier layer. In this case, the first layer can be either a decoupling layer or a barrier layer, as can the last layer.

Figure 3:
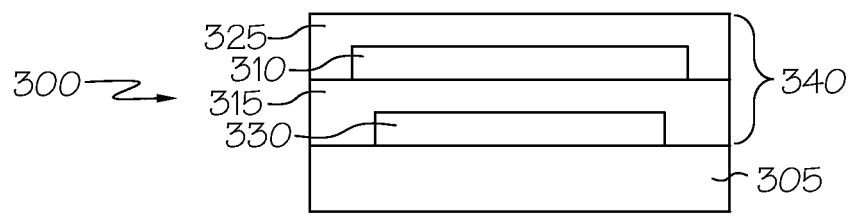
FIG. 3 is a cross-section of an embodiment of an edge-sealed, encapsulated environmentally sensitive device of the present invention.

FIG. 3 shows an edge-sealed, encapsulated environmentally sensitive device 300. There is a substrate 305 with an environmentally sensitive device 330 adjacent to it. There is a barrier stack 340 adjacent to the environmentally sensitive device 330. The barrier stack includes one decoupling layer 310 and two barrier layers 315, 325. The barrier layer 315 has an area greater than that of the environmentally sensitive device 330. Thus, the environmentally sensitive device 330 is sealed within the barrier layer 315. The barrier layers 315, 325 have an area greater than the area of the decoupling layer 310 so the decoupling layer 310 is sealed between the barrier layers 315, 325.

The environmentally sensitive device can be any device requiring protection from moisture, gas, or other contaminants. Environmentally sensitive devices include, but are not limited to, organic light emitting devices, liquid crystal displays, displays using electrophoretic inks, light emitting diodes, light emitting polymers, electroluminescent devices, phosphorescent devices, electrophoretic inks, organic solar cells, inorganic solar cells, thin film batteries, and thin film devices with vias, and combinations thereof.

It is not required that all of the barrier layers have an area greater than all of the decoupling layers, but at least one of the barrier layers must have an area greater than at least one of the decoupling layers. If not all of the barrier layers have an area greater than of the decoupling layers, the barrier layers which do have an area greater than the decoupling layers should form a seal around those which do not so that there are no exposed decoupling layers within the barrier composite, although, clearly it is a matter of degree. The fewer the edge areas of decoupling layers exposed, the less the edge diffusion. If some diffusion is acceptable, then a complete barrier is not required.

Figure 4:
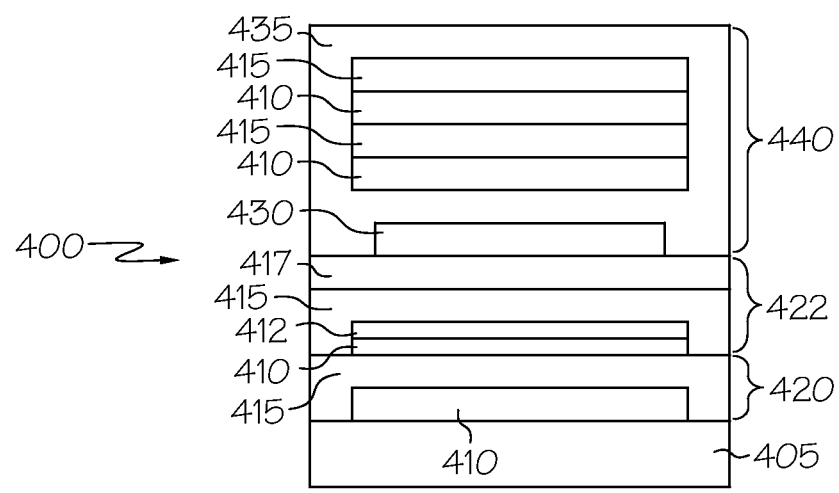
FIG. 4 is a cross-section of a second embodiment of an edge-sealed, encapsulated environmentally sensitive device of the present invention.

FIG. 4 shows an edge-sealed, encapsulated environmentally sensitive device 400. There is a substrate 405 which can be removed after the device is made, if desired. The environmentally sensitive device 430 is encapsulated between two initial barrier stacks 420, 422 on one side and one additional barrier stack 440 on the other side.

Barrier stack 420 has a barrier layer 415 which has an area greater than the area of the decoupling layer 410 which seals the decoupling layer 410 within the area of the barrier layer 415. Barrier stack 422 has two barrier layers 415, 417 and two decoupling layers 410, 412. Barrier layer 415 has an area greater than that of the decoupling layers 410, 412 which seals the decoupling layers 410, 412 within the area of the barrier layer 415. There is a second barrier layer 417.

On the other side of the environmentally sensitive device 430, there is an additional barrier stack 440. Barrier stack 440 includes two decoupling layers 410 and two barrier layers 415 which may be of approximately the same size. Barrier stack 440 also includes barrier layer 435 which has an area greater than the area of the decoupling layers 410 which seals the decoupling layers 410 within the area of barrier layer 435.

The barrier layer which seals the decoupling layer may be the first barrier layer in the barrier stack, as shown in barrier stack 420. It may also be a second (or later) barrier layer as shown in barrier stack 440. Barrier layer 435 which seals the barrier stack 440 is the third barrier layer in the barrier stack following two barrier layers 415 which do not seal the barrier stack. Thus, the use of the terms first decoupling layer and first barrier layer in the claims does not refer to the actual sequence of layers, but to layers which meet the limitations. Similarly, the terms first initial barrier stack and first additional barrier stack do not refer to the actual sequence of the initial and additional barrier stacks.

The barrier stack may include one or more decoupling layers. The decoupling layers may be made from the same decoupling material or different decoupling material. The decoupling layer can be made of any suitable decoupling material, including, but not limited to, organic polymers, inorganic polymers, organometallic polymers, hybrid organic/inorganic polymer systems, silicates, and combinations thereof. Organic polymers include, but are not limited to, urethanes, polyamides, polyimides, polybutylenes, isobutylene isoprene, polyolefins, epoxies, parylenes, benzocyclobutadiene, polynorbornenes, polyarylethers, polycarbonates, alkyds, polyaniline, ethylene vinyl acetate, ethylene acrylic acid, and combinations thereof. Inorganic polymers include, but are not limited to, silicones, polyphosphazenes, polysilazanes, polycarbosilanes, polycarboranes, carborane siloxanes, polysilanes, phosphonitriles, sulfur nitride polymers, siloxanes, and combinations thereof. Organometallic polymers include, but are not limited to, organometallic polymers of main group metals, transition metals, and lanthanide/actinide metals, or combinations thereof. Hybrid organic/inorganic polymer systems include, but are not limited to, organically modified silicates, preceramic polymers, polyimide-silica hybrids, (meth)acrylate-silica hybrids, polydimethylsiloxane-silica hybrids, ceramers, and combinations thereof.

The barrier stack may include one or more barrier layers. The barrier layers may be made from the same barrier material or different barrier material. The barrier layer can be made from any suitable barrier material. The barrier material can be transparent or opaque depending on what the composite is to be used for. Suitable barrier materials include, but are not limited to, metals, metal oxides, metal nitrides, metal carbides, metal oxynitrides, metal oxyborides, and combinations thereof. Metals include, but are not limited to, aluminum, titanium, indium, tin, tantalum, zirconium, niobium, hafnium, yttrium, nickel, tungsten, chromium, zinc, alloys thereof, and combinations thereof. Metal oxides include, but are not limited to, silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, and combinations thereof. Metal nitrides include, but are not limited to, aluminum nitride, silicon nitride, boron nitride, germanium nitride, chromium nitride, nickel nitride, and combinations thereof. Metal carbides include, but are not limited to, boron carbide, tungsten carbide, silicon carbide, and combinations thereof. Metal oxynitrides include, but are not limited to, aluminum oxynitride, silicon oxynitride, boron oxynitride, and combinations thereof. Metal oxyborides include, but are limited to, zirconium oxyboride, titanium oxyboride, and combinations thereof. Suitable barrier materials also include, but are not limited to, opaque metals, opaque ceramics, opaque polymers, and opaque cermets, and combinations thereof. Opaque cermets include, but are not limited to, zirconium nitride, titanium nitride, hafnium nitride, tantalum nitride, niobium nitride, tungsten disilicide, titanium diboride, and zirconium diboride, and combinations thereof.

The barrier layers may be deposited by any suitable process including, but not limited to, conventional vacuum processes such as sputtering, evaporation, sublimation, chemical vapor deposition (CVD), plasma enhanced chemical vapor deposition (PECVD), electron cyclotron resonance-plasma enhanced vapor deposition (ECR-PECVD), and combinations thereof.

The decoupling layer can be produced by a number of known processes which provide improved surface planarity, including both atmospheric processes and vacuum processes. The decoupling layer may be formed by depositing a layer of liquid and subsequently processing the layer of liquid into a solid film. Depositing the decoupling layer as a liquid allows the liquid to flow over the defects in the substrate or previous layer, filling in low areas, and covering up high points, providing a surface with significantly improved planarity. When the decoupling layer is processed into a solid film, the improved surface planarity is retained. Suitable processes for depositing a layer of liquid material and processing it into a solid film include, but are not limited to, vacuum processes such as those described in U.S. Pat. Nos. 5,260,095, 5,395,644, 5,547,508, 5,691,615, 5,902,641, 5,440,446, and 5,725,909, which are incorporated herein by reference, and atmospheric processes such as spin coating and/or spraying.

One way to make a decoupling layer involves depositing a polymer precursor, such as a (meth)acrylate containing polymer precursor, and then polymerizing it in situ to form the decoupling layer. As used herein, the term polymer precursor means a material which can be polymerized to form a polymer, including, but not limited to, monomers, oligomers, and resins. As another example of a method of making a decoupling layer, a preceramic precursor could be deposited as a liquid by spin coating and then converted to a solid layer. Full thermal conversion is possible for a film of this type directly on a glass or oxide coated substrate. Although it cannot be fully converted to a ceramic at temperatures compatible with some flexible substrates, partial conversion to a cross-lined network structure would be satisfactory. Electron beam techniques could be used to crosslink and/or densify some of these types of polymers and can be combined with thermal techniques to overcome some of the substrate thermal limitations, provided the substrate can handle the electron beam exposure. Another example of making a decoupling layer involves depositing a material, such as a polymer precursor, as a liquid at a temperature above its melting point and subsequently freezing it in place.

One method of making the composite of the present invention includes providing a substrate, and depositing a barrier layer adjacent to the substrate at a barrier deposition station. The substrate with the barrier layer is moved to a decoupling material deposition station. A mask is provided with an opening which limits the deposition of the decoupling layer to an area which is smaller than, and contained within, the area covered by the barrier layer. The first layer deposited could be either the barrier layer or the decoupling layer, depending on the design of the composite.

In order to encapsulate multiple small environmentally sensitive devices contained on a single large motherglass, the decoupling material may be deposited through multiple openings in a single shadow mask, or through multiple shadow masks. This allows the motherglass to be subsequently diced into individual environmentally sensitive devices, each of which is edge sealed.

For example, the mask may be in the form of a rectangle with the center removed (like a picture frame). The decoupling material is then deposited through the opening in the mask. The layer of decoupling material formed in this way will cover an area less than the area covered by the layer of barrier material. This type of mask can be used in either a batch process or a roll coating process operated in a step and repeat mode. With these processes, all four edges of the decoupling layer will be sealed by the barrier material when a second barrier layer which has an area greater than the area of the decoupling layer is deposited over the decoupling layer.

The method can also be used in a continuous roll to roll process using a mask having two sides which extend inward over the substrate. The opening is formed between the two sides of the mask which allows continuous deposition of decoupling material. The mask may have transverse connections between the two sides so long as they are not in the deposition area for the decoupling layer. The mask is positioned laterally and at a distance from the substrate so as to cause the decoupling material to be deposited over an area less than that of the barrier layer. In this arrangement, the lateral edges of the decoupling layer are sealed by the barrier layer.

The substrate can then be moved to a barrier deposition station (either the original barrier deposition station or a second one), and a second layer of barrier material deposited on the decoupling layer. Since the area covered by the first barrier layer is greater than the area of the decoupling layer, the decoupling layer is sealed between the two barrier layers. These deposition steps can be repeated if necessary until sufficient barrier material is deposited for the particular application.

When one of the barrier stacks includes two or more decoupling layers, the substrate can be passed by one or more decoupling material deposition stations one or more times before being moved to the barrier deposition station. The decoupling layers can be made from the same decoupling material or different decoupling material. The decoupling layers can be deposited using the same process or using different processes.

Similarly, one or more barrier stacks can include two or more barrier layers. The barrier layers can be formed by passing the substrate (either before or after the decoupling layers have been deposited) past one or more barrier deposition stations one or more times, building up the number of layers desired. The layers can be made of the same or different barrier material, and they can be deposited using the same or different processes.

In another embodiment, the method involves providing a substrate and depositing a layer of barrier material on the surface of the substrate at a barrier deposition station. The substrate with the barrier layer is moved to a decoupling material deposition station where a layer of decoupling material is deposited over substantially the whole surface of the barrier layer. A solid mask is then placed over the substrate with the barrier layer and the decoupling layer. The mask protects the central area of the surface, which would include the areas covered by the active environmentally sensitive devices. A reactive plasma can be used to etch away the edges of the layer of decoupling material outside the mask, which results in the layer of etched decoupling material covering an area less than the area covered by the layer of barrier material. Suitable reactive plasmas include, but are not limited to, $O_2$, $CF_4$, and $H_2$, and combinations thereof. A layer of barrier material covering an area greater than that covered by the etched decoupling layer can then be deposited, sealing the etched decoupling layer between the layers of barrier material.

Figure 5:
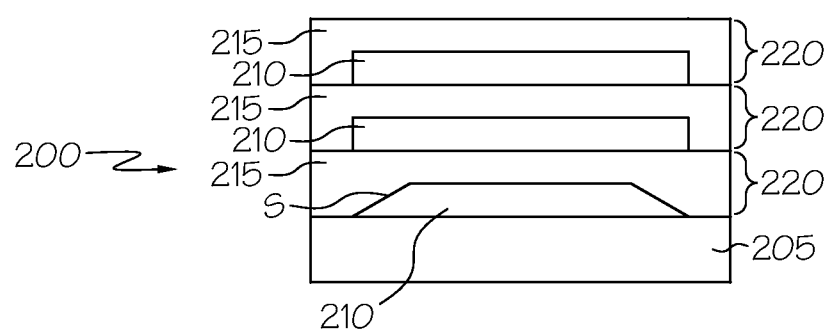
FIG. 5 shows a cross-section of the edge-sealed barrier composite of FIG. 2 with a gradual slope on at least one decoupling layer edge.

Referring again to FIG. 2 in conjunction with FIG. 5, to ensure good coverage of the edge of the decoupling layer 210 by the barrier layer 215, techniques for masking and etching the decoupling layer 210 to produce a feathered edge, i.e., a gradual slope S instead of a sharp step, may be employed. Several such techniques are known to those in the art, including, but not limited to, standing off the mask a short distance above a polymer surface to be etched.

The deposition and etching steps can be repeated until sufficient barrier material is deposited. This method can be used in a batch process or in a roll coating process operated in a step and repeat mode. In these processes, all four edges of the decoupling layer may be etched. This method can also be used in continuous roll to roll processes. In this case, only the edges of the decoupling material in the direction of the process are etched.

If a composite is made using a continuous process and the edged sealed composite is cut in the transverse direction, the cut edges will expose the edges of the decoupling layers. These cut edges may require additional sealing if the exposure compromises barrier performance.

Figure 6:
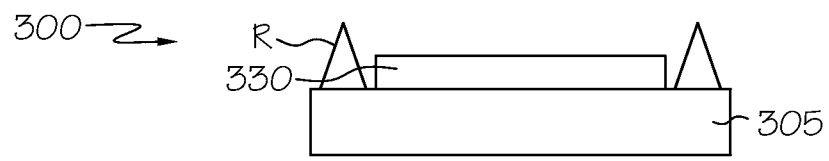
FIG. 6 shows a ridge formed on the substrate before the placement of a barrier stack.

Referring with particularity to FIG. 3 in conjunction with FIG. 6, one method for sealing edges which are to be cut involves depositing a ridge R on the substrate 305 before depositing the barrier stack 340. The ridge R interferes with the deposition of the decoupling layer 310 so that the area of barrier material is greater than the area of decoupling material and the decoupling layer 310 is sealed by the barrier layer 315 within the area of barrier material. The ridge R should be fairly pointed, for example, triangular shaped, in order to interrupt the deposition and allow the layers of barrier material to extend beyond the layers of decoupling material. The ridge R can be deposited anywhere that a cut will need to be made, such as around individual environmentally sensitive devices 330. The ridge R can be made of any suitable material, including, but not limited to, photoresist and barrier materials, such as described previously.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of making an edge-sealed barrier film composite, the method comprising:
providing a substrate consisting essentially of a polymer; and
placing a plurality of barrier stacks on the substrate such that an initial barrier stack is formed directly on the substrate, the initial barrier stack comprising at least one decoupling layer comprising an organic material and a barrier layer comprising an inorganic material such that the barrier layer of the initial barrier stack is deposited directly on the substrate, wherein the at least one decoupling layer of the initial barrier stack defines an area and is etched so that at least one edge thereof defines a gradual slope, and wherein the barrier layer of the initial barrier stack has an area that is greater than the area of the at least one decoupling layer of the initial barrier stack such that a decoupling layer of a subsequently-deposited barrier stack is sealed from the substrate by at least the barrier layer of the initial barrier stack, the placing comprising:
providing at least one mask with at least one opening therein;
depositing the at least one decoupling layer of the initial barrier stack through the at least one opening in the at least one mask; and
depositing the barrier layer of the initial barrier stack adjacent to the at least one decoupling layer of the initial barrier stack.

2. The method of claim 1, wherein at least one barrier layer of each subsequently-deposited barrier stack has an area greater than the area of the at least one decoupling layer of the initial barrier stack such that a sealing containment of the at least one decoupling layer of the initial barrier stack is formed thereby.

3. The method of claim 1, wherein the at least one barrier layer of a first subsequently-deposited barrier stack is deposited directly on a top layer of the initial barrier stack.

4. The method of claim 1, wherein the at least one decoupling layer of the initial barrier stack is etched using a reactive plasma.

5. The method of claim 4, wherein the reactive plasma is selected from $O_2$, $CF_4$, $H_2$ or combinations thereof.

6. The method of claim 1, wherein at least one of the plurality of barrier stacks comprises at least two decoupling layers therein.

7. The method of claim 1, further comprising placing an environmentally sensitive device adjacent to the substrate before the initial barrier stack is placed thereon.

8. The method of claim 1, further comprising placing an environmentally sensitive device adjacent to at least one of the plurality of barrier stacks after the initial barrier stack is placed on the substrate.

9. The method of claim 8, wherein at least one subsequently-deposited barrier stack comprises at least one decoupling layer and at least one barrier layer such that the area of the at least one barrier layer of the at least one subsequently-deposited barrier stack is greater than the area of the at least one decoupling layer of the subsequently-deposited barrier stack-such that it is sealed thereby.

10. The method of claim 1, wherein at least one of the plurality of barrier stacks is formed by laminating.

11. The method of claim 10, wherein the lamination is achieved using a process selected from heating, soldering, using an adhesive, ultrasonic welding and applying pressure.

12. A method of making an edge-sealed barrier film composite, the method comprising:
providing a substrate consisting essentially of a polymer;
placing a plurality of barrier stacks on the substrate such that an initial barrier stack is formed directly on the substrate, the initial barrier stack comprising at least one decoupling layer comprising an organic material and a barrier layer comprising an inorganic material such that the barrier layer of the initial barrier stack is deposited directly on the substrate, wherein the at least one decoupling layer of the initial barrier stack defines an area and wherein the barrier layer of the initial barrier stack has an area that is greater than the area of the at least one decoupling layer of the initial barrier stack such that a decoupling layer of a subsequently-deposited barrier stack is sealed from the substrate by at least the barrier layer of the initial barrier stack, the placing comprising:

providing at least one mask with at least one opening therein;

depositing the at least one decoupling layer of the initial barrier stack through the at least one opening in the at least one mask; and depositing the barrier layer of the initial barrier stack adjacent to the at least one decoupling layer of the initial barrier stack; and depositing a ridge on the substrate before depositing the initial barrier stack thereon, the ridge interfering with the deposition of the first decoupling layer of the initial barrier stack so that the area of the barrier layer of the initial barrier stack is greater than the area of the first decoupling layer of the initial barrier stack.

* * * * *

UNITED STATES PATENT AND TRADEMARK OFFICE
CERTIFICATE OF CORRECTION

PATENT NO. : 8,955,217 B2  
APPLICATION NO. : 13/353635  
DATED : February 17, 2015  
INVENTOR(S) : Paul E. Burrows et al.

Page 1 of 1

It is certified that error appears in the above-identified patent and that said Letters Patent is hereby corrected as shown below:

Title Page

(75) Inventors: "Paul Burrows, Kennewick, WA (US);
J. Chris Pagano, Santa Clara, CA (US);
Eric S. Mast, Richland, WA (US);
Peter M. Martin, Kennewick, WA (US);
Gordon L. Graff, West Richland, WA (US);
Mark E. Gross, Pasco, WA (US);
Charles C. Bonham, Richland, WA (US);
Wendy D. Bennett, Kennewick, WA (US);
Michael G. Hall, West Richland, WA (US)"

should read:

(75) Inventors: --Paul E. Burrows, Kennewick, WA (US);
J. Chris Pagano, Santa Clara, CA (US);
Eric S. Mast, Richland, WA (US);
Peter M. Martin, Kennewick, WA (US);
Gordon L. Graff, West Richland, WA (US);
Mark E. Gross, Pasco, WA (US);
Charles C. Bonham, Richland, WA (US);
Wendy D. Bennett, Kennewick, WA (US);
Michael G. Hall, West Richland, WA (US)--

Signed and Sealed this
Twenty-fourth Day of November, 2015

Michelle K. Lee
*Director of the United States Patent and Trademark Office*